(12) United States Patent
Li et al.

(10) Patent No.: US 11,143,781 B2
(45) Date of Patent: Oct. 12, 2021

(54) ACCOUNTING FOR TOOL BASED EFFECTS IN NUCLEAR MAGNETIC RESONANCE LOGGING DATA

(71) Applicant: Halliburton Energy Services, Inc., Houston, TX (US)

(72) Inventors: Lilong Li, Houston, TX (US); Songhua Chen, Katy, TX (US); Mark Cheiron Butler, Kingwood, TX (US)

(73) Assignee: Halliburton Energy Services, Inc.

( * ) Notice: Subject to any disclaimer, the term of this patent is extended or adjusted under 35 U.S.C. 154(b) by 278 days.

(21) Appl. No.: 16/320,155

(22) PCT Filed: Feb. 26, 2018

(86) PCT No.: PCT/US2018/019637
§ 371 (c)(1),
(2) Date: Jan. 24, 2019

(87) PCT Pub. No.: WO2019/164524
PCT Pub. Date: Aug. 29, 2019

(65) Prior Publication Data
US 2021/0063600 A1    Mar. 4, 2021

(51) Int. Cl.
*G01V 3/32*      (2006.01)
*G01N 24/08*    (2006.01)
(Continued)

(52) U.S. Cl.
CPC ............ *G01V 3/32* (2013.01); *G01N 24/081* (2013.01); *G01R 33/445* (2013.01);
(Continued)

(58) Field of Classification Search
CPC .......... G01V 3/32; G01V 3/38; G01N 24/081; G01R 33/445; G01R 33/5608; G01R 33/5615
See application file for complete search history.

(56) References Cited

U.S. PATENT DOCUMENTS 6,337,568 B1    1/2002    Tutunji et al.
7,268,547 B2    9/2007    Kruspe et al.
(Continued)

FOREIGN PATENT DOCUMENTS

WO    2015102508 A1    7/2015

OTHER PUBLICATIONS

PCT Application Serial No. PCT/US2018/019637, International Search Report, dated Nov. 21, 2018, 3 pages.
(Continued)

*Primary Examiner* — Gregory H Curran
(74) *Attorney, Agent, or Firm* — Gilliam IP PLLC

(57) ABSTRACT

An electromagnet model or models are created to generate the static and radio frequency magnetic fields of an NMR downhole logging tool. The magnetic field distributions are then used in spin dynamics (SD) simulations to model the impacts of various effects on NMR logging data, effects that cannot be accurately describe by theoretical formulation alone. The accuracy of the electromagnetic model and the SD simulation may be verified against experimental observations or trial logging runs. Simulation of electronic circuit, molecular diffusion, tool motion can all be incorporated in the SD simulation. The NMR data inversion process can be modified according to echoes obtained from SD simulation to obtain more accurate petrophysical parameters.

20 Claims, 8 Drawing Sheets

(51) Int. Cl.
*G01R 33/44* (2006.01)
*G01R 33/56* (2006.01)
*G01R 33/561* (2006.01)
*G01V 3/38* (2006.01)

(52) U.S. Cl.
CPC ..... *G01R 33/5608* (2013.01); *G01R 33/5615* (2013.01); *G01V 3/38* (2013.01)

(56) References Cited

U.S. PATENT DOCUMENTS

| | | | |
|---|---|---|---|
| 7,825,659 | B2 | 11/2010 | Georgi et al. |
| 8,680,858 | B2 * | 3/2014 | Fordham .............. G01N 24/081 324/303 |
| 2010/0277167 | A1 * | 11/2010 | Romero ................ G01R 33/383 324/303 |
| 2013/0234706 | A1 | 9/2013 | Mandal et al. |
| 2016/0018555 | A1 | 1/2016 | Jachmann et al. |
| 2016/0109612 | A1 | 4/2016 | Hurlimann et al. |
| 2016/0334533 | A1 | 11/2016 | Coman et al. |
| 2017/0285120 | A1 * | 10/2017 | Utsuzawa .......... G01R 33/3802 |
| 2017/0315257 | A1 | 11/2017 | Coman et al. |

OTHER PUBLICATIONS

PCT Application Serial No. PCT/US2018/019637, International Written Opinion, dated Nov. 21, 2018, 14 pages.
Hoult, "The signal-to-noise ratio of the nuclear magnetic resonance experiment", J. Mag. Res. 24, 71, 1976.

* cited by examiner

ACCOUNTING FOR TOOL BASED EFFECTS IN NUCLEAR MAGNETIC RESONANCE LOGGING DATA

BACKGROUND

The disclosure generally relates to the field of data processing and more particularly to revising measurements for increased accuracy.

A variety of methods may be used to determine properties of formations surrounding a borehole. A commonly used method is nuclear magnetic resonance (NMR) logging. By tuning a radio frequency (RF) pulse to the correct frequency or bandwidth, one may elicit a resonant response from hydrogen in formation materials. NMR logging can provide accurate measurements of a variety of petrophysical variables, including hydrogen porosity. Hydrogen porosity, when considered alongside other characteristics determined via NMR logging, may correspond to hydrocarbon porosity, allowing the detection and characterization of hydrocarbons in surrounding formations through NMR logging.

BRIEF DESCRIPTION OF THE DRAWINGS

Embodiments of the disclosure may be better understood by referencing the accompanying drawings.

DESCRIPTION OF EMBODIMENTS

Figure 1:
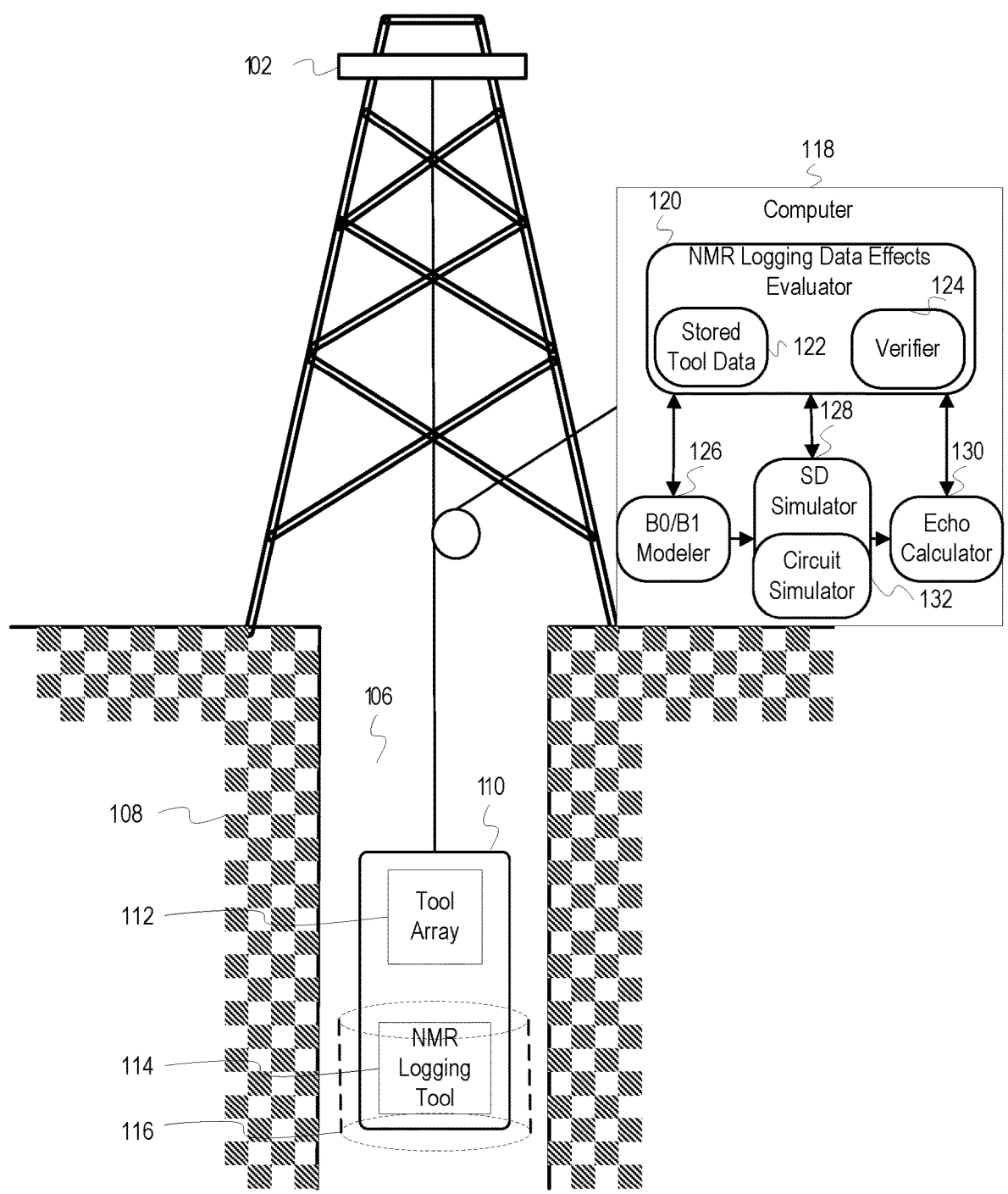
FIG. 1 depicts a borehole apparatus employing NMR logging tools and a computer to acquire and process NMR logging data.

The description that follows includes example systems, methods, techniques, and program flows that embody embodiments of the disclosure. However, it is understood that this disclosure may be practiced without these specific details. For instance, this disclosure refers to B1 fields which are tuned to resonate with hydrogen and take the form of RF pulses in illustrative examples. Embodiments of this disclosure can be also applied to B1 fields with different patterns, tunings, or sources. In other instances, well-known instruction instances, protocols, structures and techniques have not been shown in detail in order not to obfuscate the description.

Overview

For the most part, NMR logging data can be explained by theoretical formulation. Some effects, however, may influence the determination of petrophysical parameters, but cannot be described exactly by theory only. Examples of such effects include the stimulated echo effect where the first few NMR echoes deviate from the exponential decay curve, over/under prepolarization where spins do not reach the exact polarization after going through the prepolarization region during logging, inter-band interference where applying pulses on one frequency band has undesired effects on the neighboring bands, the effect of molecular diffusion on porosity reading and the stimulated echo correction, and the temperature effect which will cause a shift in B0 as well as B1 field. This disclosure refers to these effects as "undesired effects."

Sometimes the influence of undesired effects is neglected during NMR logging data processing. When not neglected, these effects are calibrated before the tool undergoes logging. However, the calibration process to remove the influence of the undesired effects as much as possible dictates a large number of repetitions of the calibration process. Furthermore, some effects depend on several variables. A tool calibration of such effects therefore maps out to a multi-dimensional space of these variables, which makes the experimental calibration practically impossible.

NMR logging data can be more accurately interpreted based on incorporating tool design as well as other environmental variables into creating precise electromagnetic models which are then consumed in spin dynamics simulations, the result of which are applied to NMR logging data.

Precise electromagnetic models are created to map out the B0 (stationary) and B1 (varying) fields. The models take into account the actual material properties such as the BH curve of the core material used, the temperature dependence of the material properties, possible environmental conditions such as borehole conductivity and formation conductivity, and any other relevant parameters. The B0 and B1 field distributions under various conditions are then used in spin dynamics (SD) simulations of the actual NMR logging sequence. To ensure the accuracy of the modeling and simulation process, a verification step may be undertaken by comparing the calculated B0 and B1 vector fields against measured values and/or by comparing SD simulation results against characteristic aspects of measured NMR logging data. This step makes sure that modeled values accurately portray measured values within some error bounds. The two types of verifications described above can also be done in combination to make sure that both the electromagnetic model and the spin dynamics simulation are accurate.

The results of these simulations of these models can be used to remove the influence of undesirable effects on the NMR logging data and allow for a more accurate determination of values of petrophysical parameters. These petrophysical parameters can include hydrocarbon saturation, hydrogen porosity, and fluid material distributions in the formations surrounding the borehole. Improving the accuracy of these values can improve drilling operations and outcomes. For example, in response to a more accurate determination of hydrocarbon saturation, a drilling operation can be directed to drill towards a region of a formation determined to have a higher hydrocarbon saturation. Formations can be profiled from the acquired parameters and drilling operations may be strictly limited to those regions which contain hydrocarbons. Obtaining the more accurate petrophysical parameter values is facilitated by more accurate modeling. Using tool designs in the creation of magnetic field models allows creation of more accurate models. Using these more accurate models as inputs for the SD simulation increases simulation result accuracy, leading to a more accurate calculation of petrophysical parameters.

To facilitate a better understanding of the present disclosure, the following examples of certain embodiments are given. In no way should the following examples be read to limit, or define, the scope of the disclosure. Embodiments of the present disclosure can be applicable to horizontal, vertical, deviated, multilateral, u-tube connection, intersection, or otherwise nonlinear wellbores in any type of subterranean formation. Embodiments may be applicable to logging data acquired with wireline, slickline, and logging while drilling/measurement while drilling (LWD/MWD).

Example Illustrations

FIG. 1 depicts a borehole apparatus employing NMR logging tools and a computer to acquire and process NMR logging data. An oil derrick 102 deploys a wireline logging tool 110 into a borehole 106 surrounded by a formation 108. The wireline logging tool 110 contains an NMR logging tool 114 with an NMR target volume 116 as well as a tool array 112. The NMR logging tool 114 and the tool array 112 send data to a computer 118 for processing. An NMR logging data effects evaluator 120 ("evaluator") installed on the computer 118 processing the NMR logging data by accounting for effects of interactions with the logging tool 110 in the NMR logging data and removes the determined effects. The evaluator 120 accounts for the effects with stored tool data 122 (i.e., data about the tool 110), a B0/B1 modeler 126, SD simulator 128, and echo calculator 130. In addition, the evaluator 120 verifies intermediate and final results with a verifier 124.

As the oil derrick 102 lowers the wireline tool 110 into the borehole 106 surrounded by the formation 108, both the tool array 112 and the NMR logging tool 114 takes measurements related to the formation 108. The NMR logging tool 114 exposes a target substance within an NMR target volume 116 in the formation 108 to static and varying magnetic fields and records spin echoes.

The NMR logging tool 114 may comprise a permanent magnet or an electromagnet along with a transmitter producing a varying RF pulse tuned to elicit a resonant response from hydrogen. A receiver or receiver array measures resultant echo signals and logs the data in local or transient memory. A stationary magnetic field ("B0") is used to polarize the magnetization of targeted matter in a precise direction. A second, varying field ("B1") can then be used to perturb the magnetization of target matter and induce a rotation of the targeted matter's magnetization. The varying field may take various forms, including a series of RF pulses which are tuned to elicit a strong response from hydrogen nuclei. The B1 field may vary in patterns which elicit a particular response signal (e.g., the Hahn Echo, CPMG (Carr, Purcell, Meiboom and Gill) cycles, etc.).

The NMR target volume 116 may be adjusted by altering the frequency and/or bandwidth of the B1 field. By doing so, data of a precise region of the formation 108 may be logged for a depth and an annular region about the NMR logging tool 114. The depth and annular region associated with any NMR dataset may be acquired from any appropriate measurement of wireline tool 110 depth and B1 field tuning, respectively. The NMR target volume 116 may also deviate from a symmetric annulus depending upon magnet type, magnet shape, implementation (e.g. shimming), and interference (e.g. from electromagnetic transmitters in tool array 112 or properties of formation 108).

Although depicted on the surface, the computer 118 can be elsewhere (e.g., on the tool, remote from the well site receiving the logged NMR data and data from the tool array 112 over a network, etc.). If the computer 118 is not implemented on the tool body, data acquired by the NMR logging tool 114 and the tool array 112 on wireline tool 110 may be communicated to the surface via data cables along/in the drill string, telemetry, or radio communications which are appropriately shielded to avoid interference with NMR/electromagnetic tool operations.

As an example, the computer 118 may exist at a remote location away from the well site. The B0/B1 modeler 126 creates one or more electromagnetic models of the tool according to the design of the tool and practical parameters such as the variation of magnetization from one magnet block to another, and the temperature dependence of the material properties. Maxwell's equations are applied to the model and these equations are solved numerically to obtain the distribution of B0/B1 fields across all space. The verifier 124 may then compare the B0/B1 fields with laboratory measurements of B0/B1 fields. The B0/B1 field distribution is then used as input to SD simulator 128, which simulates the spin dynamics under these B0/B1 conditions. The SD simulator 128 can simulate the actual pulse sequence that is used (or will be used) during NMR logging to take into account the effects from particular pulse sequences. The SD simulator 128 may also contain a circuit simulator 132 which takes into account the circuit response which may distort or delay the output of the RF pulses as well as the reception of the NMR signal. Such distortion or delay can also be frequency, temperature or borehole and formation conductive-loss dependent, resulting in a change in B1 distribution in the sensitive volume or volumes that cannot be easily calibrated or accounted for experimentally, but can be accurately modeled by the circuit simulator. Diffusion and other types of spin motion (for example motion relative to tool movement during logging or drilling operation) are also incorporated in the SD simulator 128 to take into account the effects due to diffusion and three dimensional tool motion.

The echo calculator 130 calculates the aggregated echo signal from all spins using outputs from the SD simulator 128 and the B0/B1 modeler 126. If the receiving circuit is different from the one that applies the RF pulses, another B1 field modeling for the receiving circuit is done to get the B1 distribution used in echo signal calculation. At this stage, one may choose again to verify the echo signal calculation against the experimental observation or against a trial logging run to ensure the accuracy of the SD simulation as well as the B0/B1 field modeling. Calculated echo signal amplitudes can then be applied in NMR data interpretation.

This technology is applicable to a large variety of NMR logging tools/systems and should not be misconstrued as being limited to either wireline logging tools or those tools which utilize RF pulses. By providing the design of employed tools, this technology may be applied to various downhole NMR logging applications. For example, the NMR logging tool can be included in a bottomhole assembly of a drilling system to perform measurement while drilling (MWD) or logging while drilling (LWD).

Figure 2:
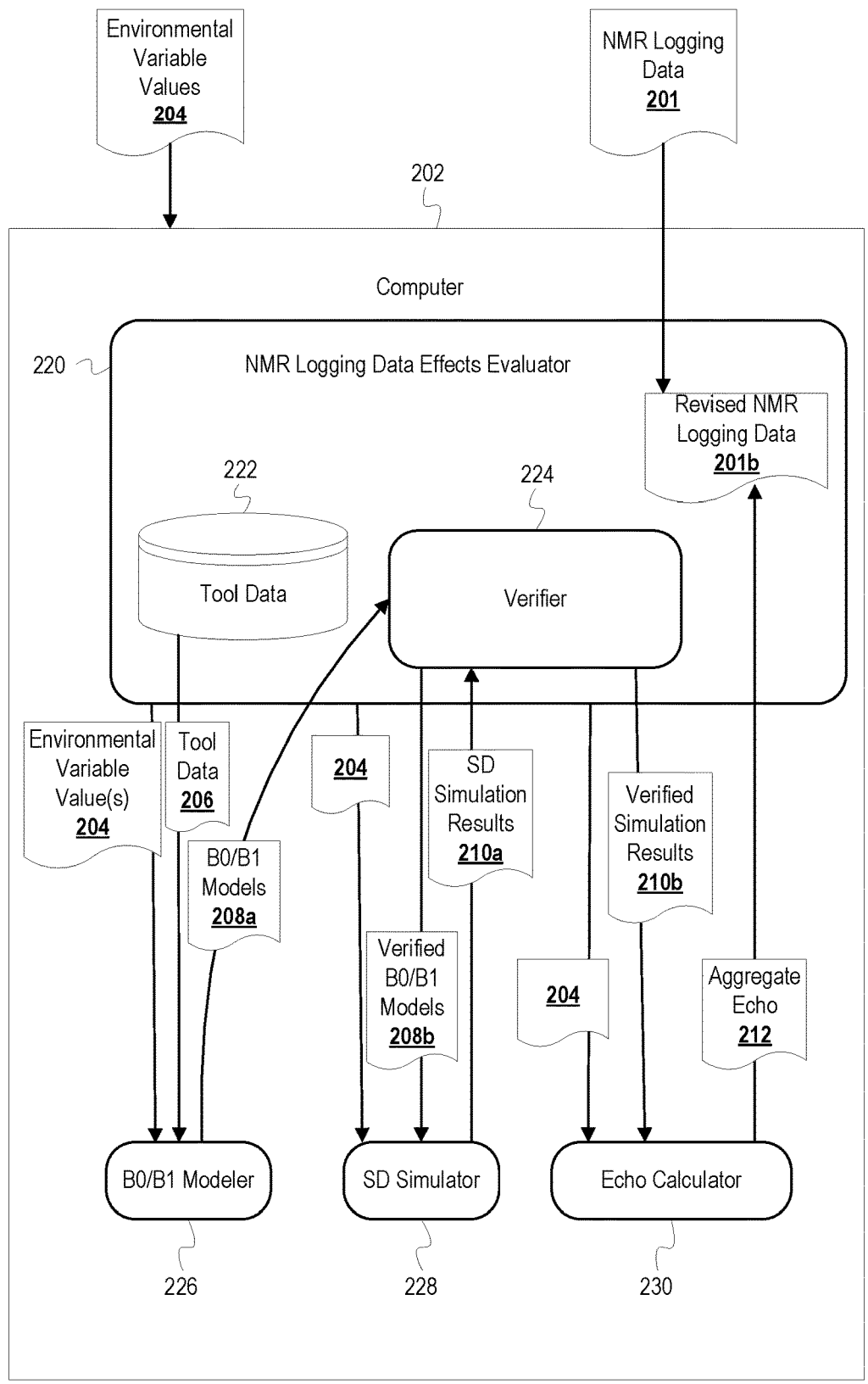
FIG. 2 depicts an example architecture of an NMR logging data effects evaluator.

FIG. 2 depicts an example architecture of an NMR logging data effects evaluator. The evaluator 220 includes or has access to tool data repository 222 (e.g., database) and includes a verifier 224. The evaluator 220 orchestrates flow of inputs and outputs across a B0/B1 modeler 226, an SD simulator 228, and an echo calculator 230 to account for undesired effects which cannot be quantitatively determined by theoretical formulation in the logging data. The evaluator 220 allows for data corrections including but not limited to stimulated echo correction, motion related porosity and $T_1$ or $T_2$ distribution correction, correction due to insufficient saturation, and correlation of effects due to distorted RF pulse shapes due to imperfect electronics responses.

The inputs and outputs which the evaluator 220 sends to and receives from the B0/B1 modeler 226, the SD simulator 228, and the echo calculator 230 include values 204 of environmental variables, tool data 206 from the tool data repository 222, B0/B1 models 208 produced by the B0/B1 modeler 226, simulation results 210 produced by the SD simulator 228, and an aggregate echo 212 produced by the echo calculator 230.

The B0/B1 modeler 226 models B0 and B1 fields throughout the NMR target volume. The B0/B1 modeler 226 and may also receive as input the environmental variable values 204. The B0/B1 modeler solves Maxwell's equations based on the input(s) to model the electromagnetic fields which are produced by an NMR logging tool. As mentioned earlier, circuit and tool design may cause fluctuations in current or voltage when producing, transmitting, or receiving magnetic signals, which may manifest as deviations in B0/B1 fields from ideal waveforms. Downhole temperature as well as borehole and formation conductive loss may be included in the environmental variables. Other environmental variables may be measured by a tool array and the values provided to the B0/B1 modeler 226 by the evaluator 220 as part of the values 204. While the measurement of the environmental variables may be performed prior to or after NMR logging by sensors which may exist on a separate downhole tool from that of the NMR logging tool, taking the measurements of those of the environmental variables which are subject to change over time (such as downhole temperature) may be done concurrently with the NMR logging. Downhole tools other than the NMR logging tool may also produce electromagnetic signals which alter the magnetization of formation materials in the NMR target volume, and thus data about their tool designs may also be included in the tool data repository 222 and provided as part of the tool data 206 when modeling magnetic fields. Modeling the B1 field based on circuit simulations of the NMR logging tool (and possibly other tools downhole during NMR logging) and environmental variables allows the modeling to account for deviation of magnetic fields from ideal waveforms that cannot be determined experimentally. Output from the B0/B1 modeler 226 specifies B0 and B1 field values within downhole formations as well as the derivatives of those B0 and B1 fields. The B0/B1 modeler 226 may include solving Maxwell's equation by using the finite element method, the finite volume method, or another appropriate numerical method. The B0/B1 modeler 226 output B0/B1 models 208a to the evaluator 220.

The verifier 224 compares the B0/B1 models 208a to magnetic fields measured experimentally in the laboratory by the NMR logging tool to verify the B0/B1 models 208a. The operations of the verifier 224 are explored in greater detail in the FIG. 3 description. A maximum error bound may be used to determine whether or not the B0/B1 models 208a are sufficiently accurate. Since the verifier 224 may modify the B0/B1 models 208a, the description refers to the B0/B1 models after verification as verified B0/B1 models 208b regardless of whether the verification involved modification.

The evaluator 220 communicates as inputs to the SD simulator 228 the verified B0/B1 models 208b and the environmental variable value(s) 204. The SD simulator 228 simulates the propagation of spin dynamics over time to determine expected echo strength for various materials. The SD simulator 228 simulates based on B0 and B1 values and gradients at discrete data points from the verified B0/B1 models 208b as well as the environmental variable values 204 (e.g., downhole temperature). The SD simulator 228 simulates the echo of resonating spins within one or several NMR target volumes. SD simulator 228 operations may comprise iteratively solving Bloch equations or using known propagators for RF pulses, spin-lattice relaxation, and spin-spin relaxation to calculate the density matrix propagation. Calculating the propagation of the density matrix may often be preferable for reasons of computational ease. It is possible to consider the effects of various interactions or deviations from the assumptions of physical theory on NMR measurements by altering the time domain echo data. Such is the case when these effects are not dependent on $T_1$, $T_2$, or D. Examples of such effects include stimulated echo effects when the influence of diffusion is insignificant; additional signal variation as a result of tool motion during the CPMG cycle, among others. However, certain effects, particularly those which strongly depend upon $T_1$, $T_2$, or D (such as over- or under-prepolarization of resonant spins, inter-band interference; insufficient saturation in saturation-recovery pulse sequence, among others), may incur nonlinear effects on logged NMR data, in which case the inversion matrix may require alteration. The SD simulator 228 outputs simulation results 210a to the evaluator 220. The simulation results 210a may comprise expected spin echo signals for various T1/T2/D values, as well as accounting for a variety of interactions and effects.

The verifier 224 compare the simulation results 210a to NMR echo data measured in a laboratory setting or measured in the borehole during a trial logging run to verify the simulation results 210a. The operations of the verifier 224 are explored in greater detail in the FIG. 3 description. A maximum error bound may be used to determine whether or not the simulation results 210a are sufficiently accurate. As with the B0/B1 models, the result of the verification of the simulation results 210a, whether modified or not due to verification, is referred to as verified simulation results 210b.

The evaluator 220 communicates as inputs to the echo calculator 230 the verified simulation results 210b and the environmental variable values 204. The echo calculator 230 computes aggregate echo 212 based on these inputs.

The echo calculator 230 communicates the computed aggregate echo 212 to the evaluator 220. In the case when the effects which cannot accounted for by theory alone are not dependent on T1, T2 or D, the NMR logging data 201 is revised and NMR logging data 201b is generated. An example of such revision is presented by FIG. 7. In the case when the effects are dependent on T1, T2 or D, the NMR data inversion matrix has to be modified to get the correct output for petrophysical interpretation. This matrix modification step is explained in more detail in the FIG. 3 description below.

With the orchestration of modeling and simulations and resulting aggregate echo 212, the evaluator 220 may assume a particular tool design and configuration and work across all instances of the same tool model/configuration. It may also incorporate features/defects of a certain tool and thus work only for a particular tool that has such features/defects. It may assume a particular pulse sequence used in logging operation and revise the NMR inversion accordingly when that pulse sequence is used during logging. It may assume a pulse sequence but apply the revision to NMR inversion more broadly when the effects of concern are applicable more broadly.

Figure 3:
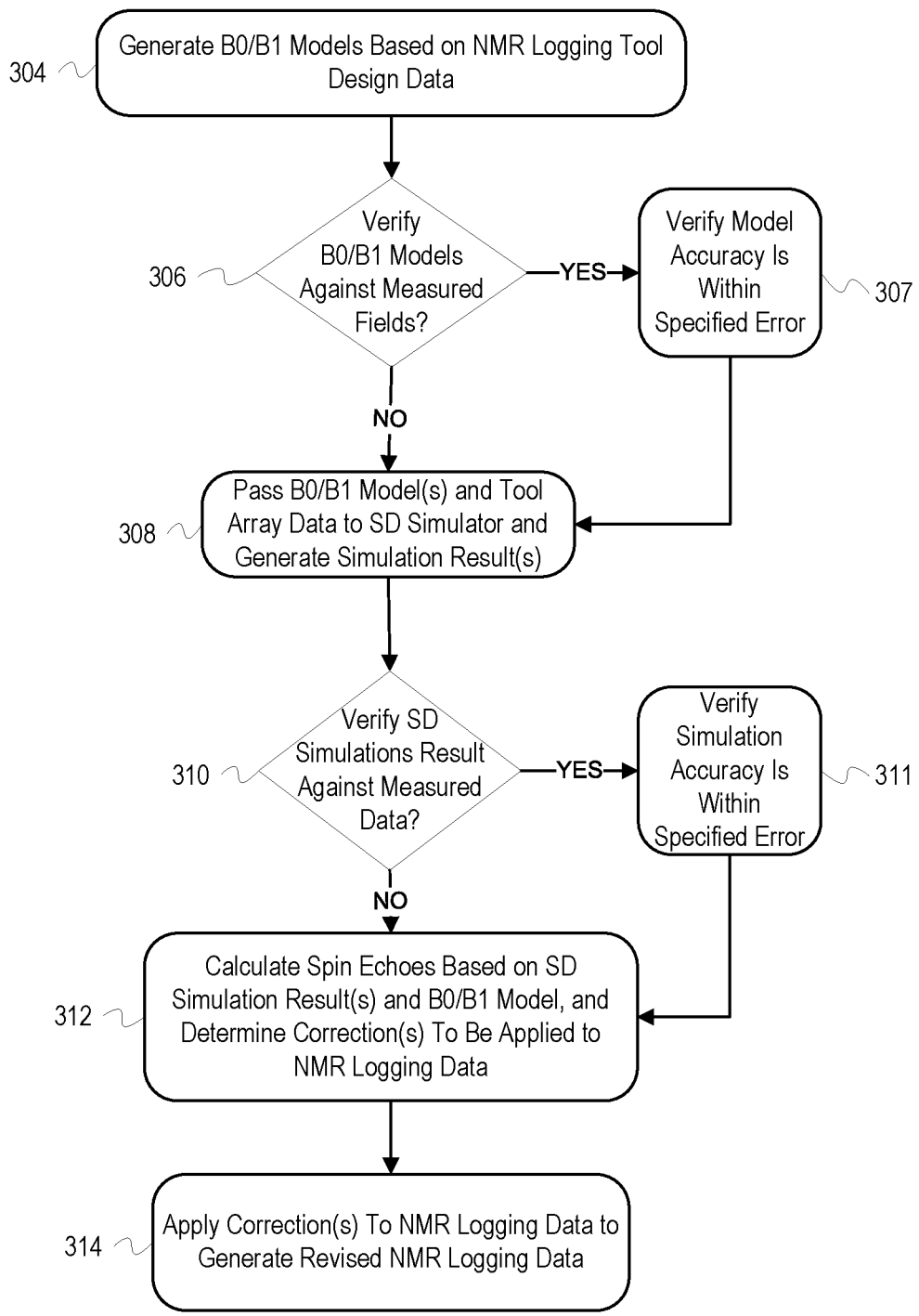
FIG. 3 is a flowchart of example operations for determining and accounting for tool interaction effects in NMR logging data.

FIG. 3 is a flowchart of example operations for determining and accounting for tool interaction effects in NMR logging data. For consistency, the description refers to an evaluator as performing the example operations. While an evaluator (e.g., a computer program) can include program code for the B0/B1 modeling, SD simulation, and aggregate echo correction, these example operations presume that the evaluator interfaces with other programs written for the specific functionalities of B0/B1 modeling, SD simulation, and aggregate echo correction. The evaluator interfaces with these programs and orchestrates the flow of inputs and outputs which may be modified based on verification by the evaluator.

At block 304, the evaluator generates B0/B1 models based on design and/or configuration data of an NMR logging tool. The evaluator can also generate the B0/B1 models with environmental variable values that account for the tool and environmental measurements. The B0/B1 modeler will create a computational model of the B0 and B1 fields across space. The produced B0/B1 model may at least comprise either B0, B1, and B0 gradient values or B0 and B1 values for a set of discrete coordinates which lie within an NMR target volume. Each B0 field, B1 field, or B0 field gradient value in the B0/B1 model corresponds to coordinates within an NMR target volume if it is to be used to correct NMR logging data as NMR data is collected from NMR target volumes. Since spins may diffuse or otherwise move relative to the tool, the B0 field, B1 field, and B0 field gradient may be communicated interactively to the SD simulator (304 and 308 applied interactively and repeatedly).

Figure 4:
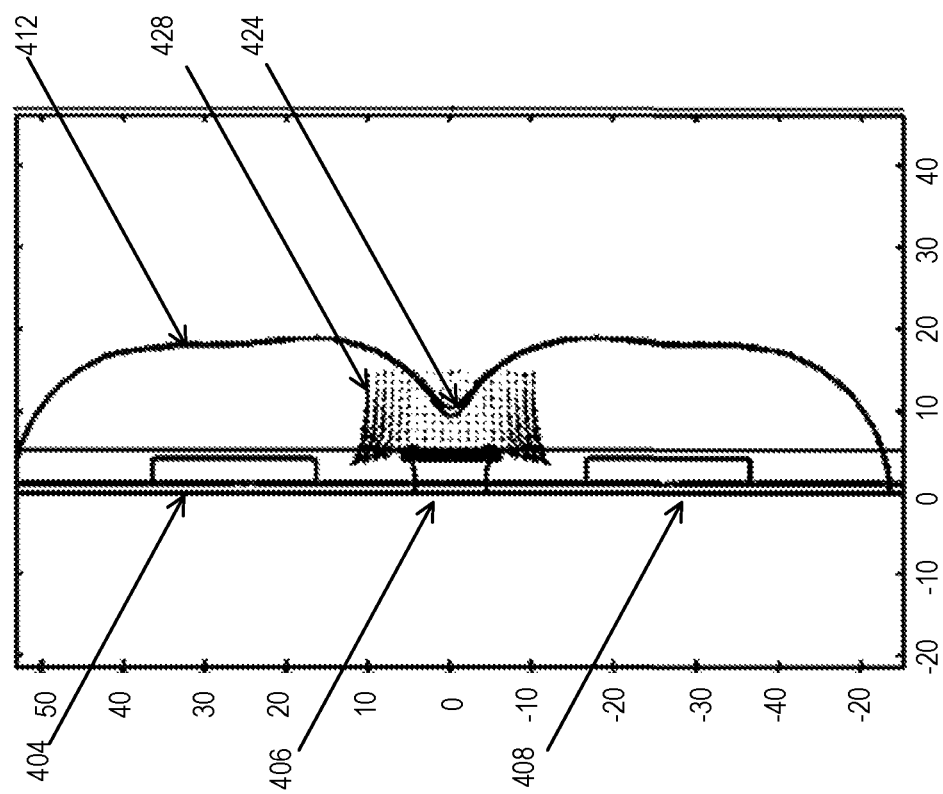
FIG. 4 illustrates an example of partial B0/B1 models superimposed over an example NMR tool.

FIG. 4 depicts an example NMR logging tool with a modeled B0 vector field superimposed over a 2D cross-section of an NMR target volume 424. The tool includes two magnets 404, 408 and a core material 406, which is a substance placed inside coils to increase RF magnetic field strength. Core material 406 selection may depend upon magnetic permeability of the material in use as well as B1 field frequency. The x-axis represents distance from the longitudinal tool axis and the y-axis represents a borehole depth. A magnetic field contour line 412 indicates a region of equal field strength. The NMR target volume 424, represented by the indicated area between two parabolas, indicates the region in which hydrogen will have a resonant response to NMR fields. A vector field 428, comprising a set of arrows superimposed over the NMR target volume 424, indicates magnetic field values near the resonant hydrogen. The vector field 428 is part of an example magnetic field model which may be used for SD simulations.

Although "B0/B1 model" and "B0/B1 models" have been used interchangeably, both refer to structures which contain identical information. As discussed above, the information to perform SD simulations includes two or three sets of field values defined for coordinates which lie within NMR target volumes. The claims refer to "an electromagnetic model" because an electromagnetic model encompasses any and all relevant information for SD simulation which may be included in one or several "B0/B1 model(s)". Furthermore, the use of multiple B0/B1 models with differing field values for the same coordinates would constitute repeated data correction.

Returning to FIG. 3, the evaluator determines whether to verify the B0/B1 models obtained from the modeler at block 306. Whether or not the evaluator verifies the B0/B1 models can be specified in configuration settings of the evaluator. Because the variation of physical tools from specified tool designs may not be known and B0/B1 models are created in a virtual environment which uses those exact tool designs, verifying the accuracy of B0/B1 models may ensure that modeled values accurately represent physical measurements. If the evaluator is configured to verify the B0/B1 models, then control flows to block 307. If not, then control flows to block 308.

At block 307, the evaluator verifies the B0/B1 models by comparing the B0/B1 models against measured magnetic fields based on error bounds specified in the evaluator settings. The evaluator will verify that magnetic field model accuracy is within the specified error bounds. As an example, this verification process may include taking a ratio of modeled to measured field values and either accepting or rejecting the model based on whether said ratio falls within the provided error bounds. If the ratio of modeled to measured field values falls outside of the provided error bounds, B0/B1 models can be improved, possibly by taking into account more realistic consideration of the material properties. An example comparison between a B0 model and a measured B0 field is shown in FIG. 5.

Figure 5:
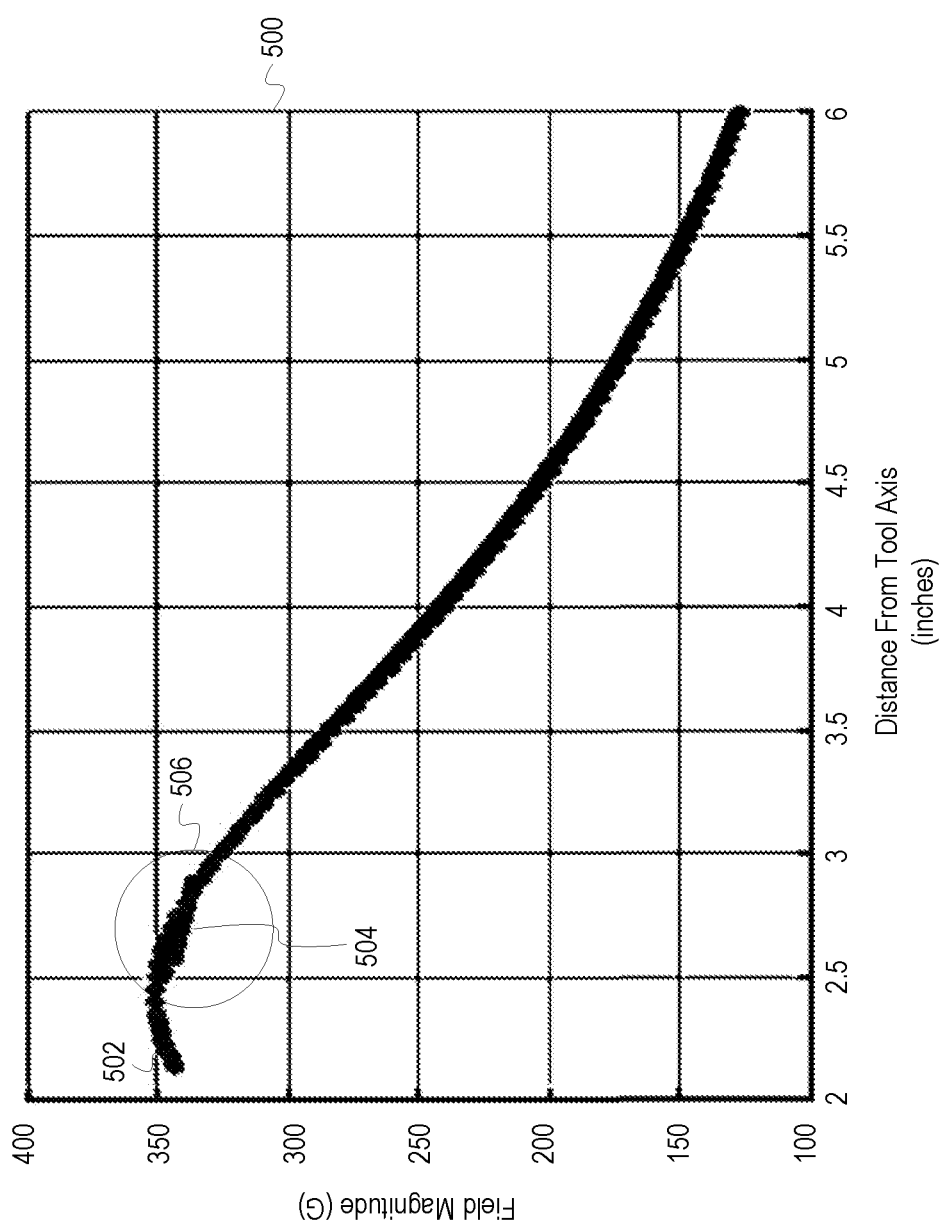
FIG. 5 depicts a graph comparing modeled and measured B0 fields.

FIG. 5 depicts a graph comparing modeled and measured B0 fields. A plot 500 shows a modeled B0 field 502 against a measured B0 field 504. The x-axis represents a distance from the tool axis in units of inches and the y-axis represents a field magnitude in units of gauss (G). As can be seen, measured values agree with modeled values more than 3 inches from the tool axis. A difference in the two values 506 was not consistently reproduced by plots at different positions along the antenna, so it may be taken as a modeling artifact and demonstrates the importance of verifying model accuracy. By analyzing graphs similar to the plot 500, field model accuracy may be verified to lie within a predefined error bound of measured magnetic fields.

Returning to FIG. 3, the evaluator passes (verified) B0/B1 models and environmental variable values to the SD simulator at block 308. The evaluator can be set to specify to the SD simulator which interactions are to be simulated, such as over- or under-prepolarization. Additional parameters may also include specification of simulation rules, such as a range of logging speeds to derive over- or under-prepolarization effects. An optimal number of simulations and simulation resolution may depend upon the physical system computing the simulations. Many simulations may be conducted simultaneously or sequentially. As mentioned earlier, embodiments can iteratively generate electromagnetic field models with varying parameters, run SD simulations based on each generated electromagnetic field model, and vary the parameters for the electromagnetic field model generation based on results of the SD simulations.

SD simulations may be computed by solving the Bloch equations, which are a set of differential equations relating the nuclear magnetization of a substance ("M") to its time derivative ("dM/dt"). The Bloch equations may be solved by using the finite difference method or other appropriate numerical methods. Alternately, SD simulations may comprise determining the propagators for the magnetization of different formation materials. This approach is often utilized as it may require less computational power. A means of computing the propagator may include dividing NMR target volumes into a large number of small volumes known as "voxels". Spins within each voxel may be assigned a B0 field value, a B1 field value, and a B0 field gradient value from the B0/B1 modeler output. Spins may diffuse or change during the simulation timeframe, but B0, B1, and B0 gradient values are known from B0/B1 models. Spins may be assumed to interact with each other only through spin-spin relaxation and spin-lattice relaxation. As mentioned earlier, the SD simulation may incorporate circuit simulation to more accurately describe the B1 field variation as a function of time (the B1 field output from field models may assume unit current, but in SD simulation, the current will change as a function of time, e.g. shaped RF pulses and no current periods) and more accurately describe the filtering effect to the NMR signal by the reception circuit. The shape of the RF pulses in the time domain may be taken as an ideal pulse shape, a pulse shape obtained from the circuit simulation of NMR logging tool circuitry, or measured pulse shape.

A common implementation of B1 fields are so-called "echo trains", which constitute a repeated series of pulses (such as a Hahn echo) which elicit strong echo responses from the NMR target substance. A commonly used echo train is the CPMG cycle, which comprises a series of B1 pulses to rotate magnetization in a particular direction and periods with no B1 field which allows the measurement of spin echoes between RF pulses. A CPMG cycle can comprise a 90° RF pulse (90° denoting the change from the prior direction of magnetization polarization) followed by a number of 180° RF pulses an interecho time "TE" after, with every 180° pulse occurring TE after the last. At a time TE/2 after each 180° pulse, an echo may be observed, which corresponds to the temporary alignment of magnetization of various materials with a distribution of dephasing speeds. According to physical theory, the amplitude of these echoes is expected to decay exponentially in time after the first few echoes when the B0 field is grossly inhomogeneous. This effect is called the "stimulated echo effect" and is depicted in further detail by FIG. 7.

Figure 7:
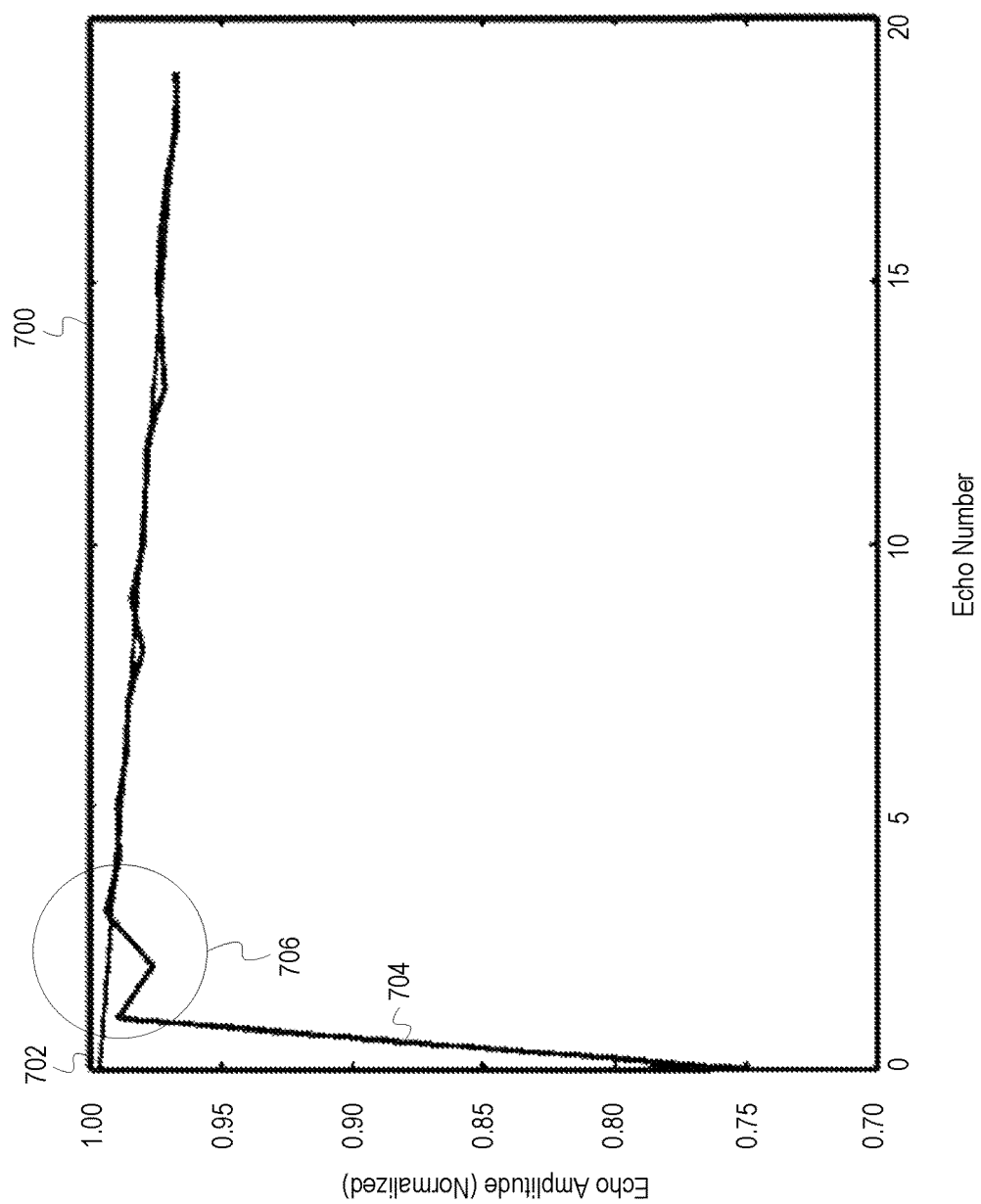
FIG. 7 depicts the amplitudes of echoes in an echo train and compares measured values against expected values for a tool configuration at a particular frequency.

FIG. 7 depicts the amplitudes of echoes in an echo train and compares measured values against expected values for a tool configuration at a particular frequency. The y-axis represents echo amplitude in units of initial echo amplitude percentage. The x-axis represents echo number. An expected echo amplitude decay is portrayed by the line 702. A line 704 depicts measured echo amplitudes. A difference between measured 704 and expected 702 echo amplitudes 706 corresponds to an effect known as the stimulated echo effect. From the difference 706 between measured 704 and expected echo amplitudes 702, a correction factor may be derived for the tool, allowing data correction. Such a correction factor (or factors) may be applied to time domain echo data before NMR data inversion. A simulated value for a correction factor may also be compared to measured echo values during verification of simulation accuracy. The stimulated echo effect is an example of an effect which may be corrected in logged NMR data by the NMR logging data effects evaluator.

While some deviations from expected measurements may be corrected by modifying time domain echo data, those effects which depend upon $T_1$, $T_2$, or D may involve the SD simulator conducting more complex alterations of the inversion matrix. An illustrative example is shown below to account for the over- or under-prepolarization effect by modifying the inversion matrix.

The $i^{th}$ echo in an echo train with $j^{th}$ interecho time "$TE_j$" and $k^{th}$ wait time "$TW_k$" from the $l^{th}$ target volume which experience field gradient strength $G_l$ is given by the relation:

$$E(i,j,k,l) = \Sigma_{m=1}^M \Sigma_{n=1}^N \Sigma_{p=1}^P E_{0,mnp}[1-\exp(-TW_k/T_{1,m})]\exp(-i\cdot TE_j/T_{2,n})\exp(-\gamma^2 G_l^2 i \cdot TE_j^3 D_p/12) + \text{noise} \quad (1)$$

This can be rewritten in matrix form as:

$$Ax = b \quad (2)$$

The matrix A is given by:

$$A = [1-\exp(-TW_k/T_{1,m})]\exp(-i\cdot TE_j/T_{2,n})\exp(-\gamma^2 G_l^2 i \cdot TE_j^3 D_p/12), \quad (3)$$

with rows of A containing the enumeration of all combinations of m, n, p and columns of A containing the enumeration of all combinations of i, j, k, l, x as a column vector which is an enumeration of all components $E_{0,mnp}$ (the formation porosity distribution for all $T_{1,m}$, $T_{2,n}$, and $D_p$), and b as a column vector which contains the amplitudes of all observed echoes Solutions to equation (2) will be unstable with even small amounts of noise; thus, it is ill-posed and regularization is recommended to solve for x by finding the minimum:

$$\min[(Ax-b)^2 + \alpha\|W\cdot x\|^2], \text{ with } x \geq 0, \quad (4)$$

Where W is a regularization matrix and a is a regularization parameter.

For those effects which do not depend upon $T_{1,m}$, $T_{2,n}$, or $D_p$, a simple correction of the time-domain echo data may be used. However, for those effects which do depend upon $T_{1,m}$, $T_{2,n}$, or $D_p$, more complex corrections may be necessary.

For example, over- or under-prepolarization of magnetization depends upon $T_{1,m}$. Therefore, one must modify A by an unknown function of $T_{1,m}$:

$$A' = p(T_{1,m})[1-\exp(-TW_k/T_{1,m})]\exp(-i\cdot TE_j/T_{2,n})\exp(-\gamma^2 G_l^2 i \cdot TE_j^3 D_p/12) \quad (5)$$

For over-prepolarization, p>1; for under-prepolarization p<1. The functional form of $p(T_{1,m})$ is not necessarily known and may vary for different logging speeds. Therefore, for a particular tool configuration, SD simulations may be run for a variety of $T_1$ values and logging speeds. From the output of these simulations, $p(T_{1,m})$ may be acquired for various $T_{1,m}$ values and logging speeds. Once either of these descriptions of p have been acquired, the inversion matrix may be corrected for under- or over-prepolarization as needed for NMR measurements (e.g., at a particular logging speed).

Other effects which may be considered include diffusion effects, inter-band interference, insufficient spin recovery between CPMG pulse train excitations, or insufficient saturation before CPMG pulse train excitations.

The effects to be corrected may depend on a number of parameters such as D, T1, T2, TE, TW, logging speed, temperature, or RF frequency. So, a large number of simulations may be needed which result in huge multi-dimensional matrixes to be used for corrections. Machine learning or big data analytic tools may be used to derive functional dependencies from these large data sets. An advantage of using machine learning or data analytics tools to derive functional dependencies is that numerical noise inherent in modeling and simulations may be reduced.

At block 310, the evaluator determines whether to verify the SD simulations results against measured NMR values. If the evaluator is configured with an error bound, the evaluator will verify that simulation result accuracy is within the specified error bound. If the evaluator verification is indicated, then control flows to block 311. Otherwise, control flows to block 312.

At block 311, the evaluator verifies that the simulation result accuracy is within specified error bounds. This verification process may comprise comparing a ratio of characteristic aspects of SD simulation output to characteristic aspects of logged NMR data against specified error bounds. Such characteristics may include the exact shape of an NMR echo among a CPMG echo train at a particular frequency or stimulated echo correction (i.e., the relative amplitudes of the first few echoes in the CPMG echo train). Accurate simulation of these characteristics indicates the accuracy of the simulations.

Upon taking the ratio of simulated to measured characteristics of NMR data, the evaluator or verifier may find the ratio to be acceptable or unacceptable. This decision is formed by the specified error bounds. If the ratio is not acceptable, the B0/B1 model or the SD simulator may have to be improved, possibly by incorporating more realistic parameters (for example more accurate RF pulse shape from measurements) or more realistic material properties.

For greater accuracy, both block 307 and block 311 may be executed to ensure that models and simulations are representative of the physical system.

At block 312, the evaluator calculates spin echoes based, at least in part, on the SD simulation result(s) and B0/B1 model, and determines a modification(s) to apply to NMR logging data. To calculate the spin echoes, the evaluator passes simulation results and environmental variable values to the echo calculator. The echo calculator will return an aggregate echo to the evaluator. If receivers used in the NMR logging tool have their own circuit, knowledge of this circuit (e.g., circuit simulations) may be used to create an effective filter for the receiving circuit. The filter may be considered alongside the output of each SD simulation prior to computing an aggregate echo signal. Subsequent digital processing of NMR data (e.g., data filtering) may be included in numerical calculations as well.

At block 314, the evaluator applies the determined modifier(s) to NMR logging data. Applying the correction(s) can involve either modifying the time domain NMR echo data with a determined correction factor(s) or simulated correction factor(s), or modifying the inversion matrix, to more accurately derive petrophysical parameters including fluid porosity, hydrogen-linked fluid presence, and the material types correlating to fluid presence. Materials may be determined by evaluating $T_2$ measurements, which can indicate the presence of fluids and may further specify whether the fluid resides in clay, water, or light or heavy oils. Hydrogen presence indicates hydrocarbons, so these parameters may be used to profile downhole formations or inform or determine the benefits of further drilling operations. Thus, the corrections to NMR data inversion can be used to increase the accuracy of the formation profile.

Figure 6:
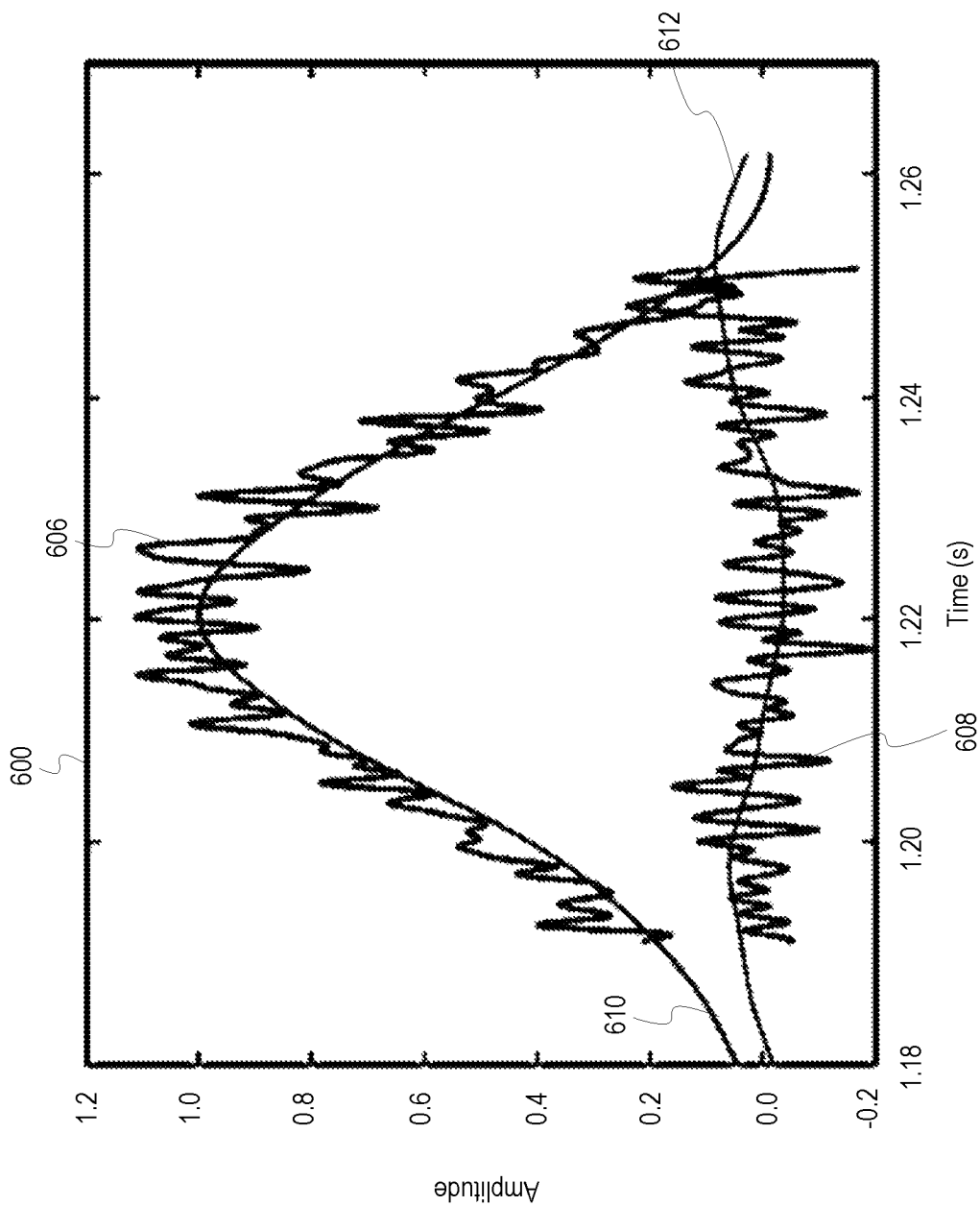
FIG. 6 depicts a logged NMR echo signal, portraying both measured and simulated values of both real and imaginary components of the signal.

FIG. 6 depicts a logged NMR echo signal, portraying both measured and simulated values of both real and imaginary components of the signal. A plot 600 depicts a measured real signal 606, a measured imaginary signal 608, a simulated real signal 610, and a simulated imaginary signal 612. The x-axis represents time in seconds and the y-axis represents signal amplitude. The close match between experimental data and simulation results verifies the accuracy of simulation results.

The examples often refer to an "evaluator" and refer to a "verifier." These are logical constructs used to refer to implementation of computing functionality. These constructs are utilized since numerous implementations are possible due to various computing platforms, programming languages, and developer/programmer preferences. An evaluator or verifier can comprise a particular component or components of a machine (e.g., a particular circuit card enclosed in a housing with other circuit cards/boards), machine-executable program or programs (e.g., an implementation of the finite element method), firmware, a circuit card with circuitry configured and programmed with firmware for performing the above described operations. The terms are used to efficiently explain content of the disclosure. Although the examples refer to operations being performed by an evaluator and a verifier, different entities can perform different operations.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in FIG. 3 can be modified to perform in parallel or concurrently for multiple SD simulations. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

The program code/instructions may also be stored in a machine-readable medium that can direct a machine to function in a particular manner, such that the instructions stored in the machine readable medium produce an article of manufacture including instructions which implement the function/act specified in the flowchart and/or block diagram block or blocks.

Figure 8:
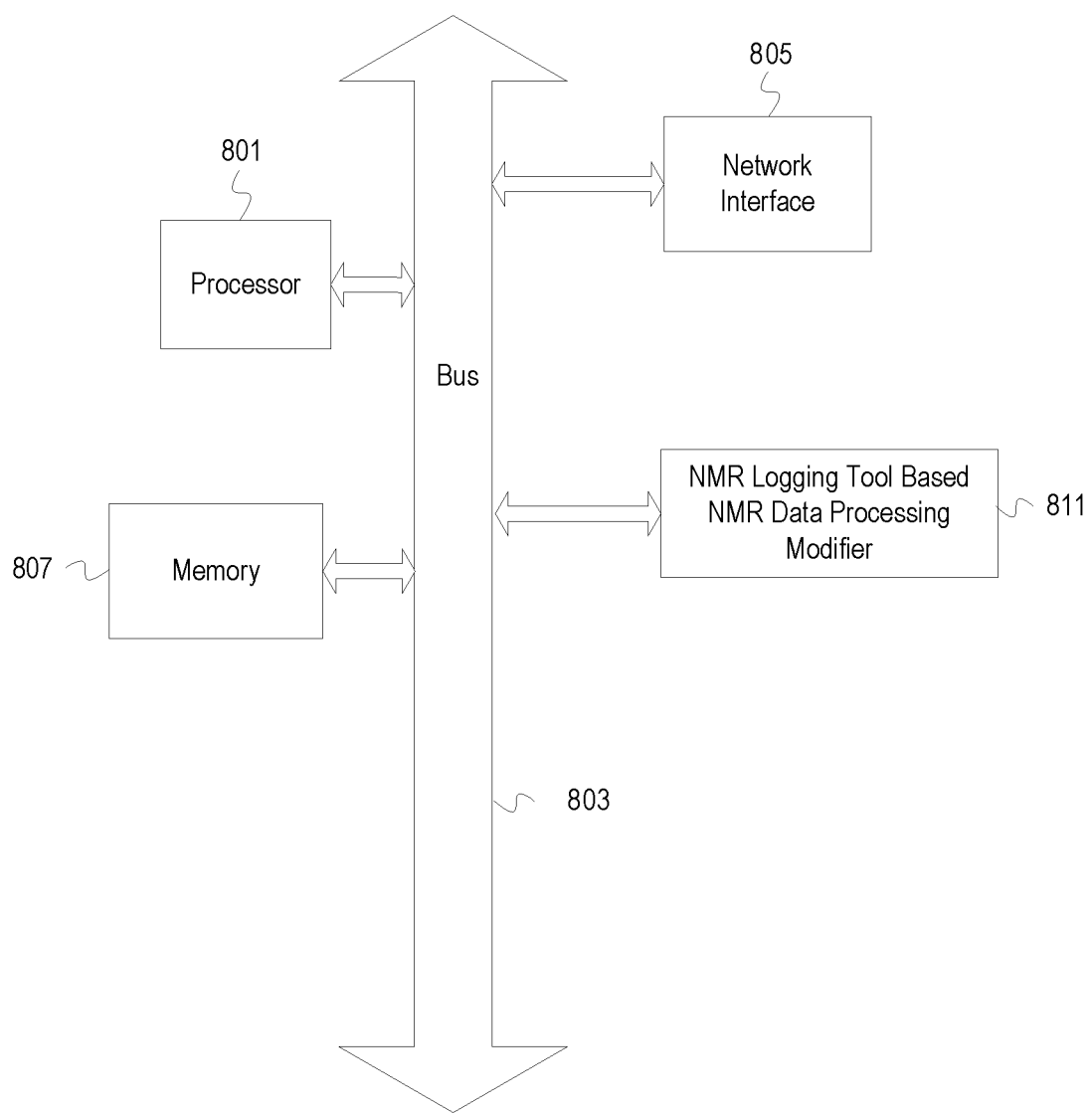
FIG. 8 depicts an example computer system with an NMR logging data evaluator.

FIG. 8 depicts an example computer system with an NMR logging data evaluator. The computer system includes a processor 801 (possibly including multiple processors, multiple cores, multiple nodes, and/or implementing multithreading, etc.). The computer system includes memory 807. The memory 807 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 803 (e.g., PCI, ISA, PCI-Express, Hyper- Transport® bus, InfiniBand® bus, NuBus, etc.) and a network interface 805 (e.g., a Fiber Channel interface, an Ethernet interface, an internet small computer system interface, SONET interface, wireless interface, etc.). The system also includes an NMR logging tool based NMR data processing modifier 811 ("modifier"). The NMR logging tool based NMR data processing modifier generator 811 determines time domain NMR echo data corrections and/or inversion matrix modifications based on the tool data based modeling and simulations as previously described. Any one of the previously described functionalities may be partially (or entirely) implemented in hardware and/or on the processor 801. For example, the functionality may be implemented with an application specific integrated circuit, in logic implemented in the processor 801, in a co-processor on a peripheral device or card, etc. Further, realizations may include fewer or additional components not illustrated in FIG. 8 (e.g., video cards, audio cards, additional network interfaces, peripheral devices, etc.). The processor 801 and the network interface 805 are coupled to the bus 803. Although illustrated as being coupled to the bus 803, the memory 807 may be coupled to the processor 801.

Example Embodiments Include the Following:

Embodiment 1

A method comprising: generating a B0/B1 model that is based, at least in part, on a nuclear magnetic resonance (NMR) logging tool; running one or more spin dynamics simulations based, at least in part, on the B0/B1 model to generate a set of one or more spin dynamics simulation results; computing a set of one or more spin echoes based, at least in part, on the set of one or more simulation results and the B0/B1 model; and determining a set of one or more modifiers to apply to NMR logging data processing, wherein determining the set of one or more modifiers is based, at least in part, on the set of one or more spin echoes.

Embodiment 2

The method of Embodiment 1, wherein determining the set of one or more modifiers comprises determining a set of one or more correction factors based on one or more differences between amplitudes of the set of one or more spin echoes and amplitudes of a set of one or more expected spin echoes, wherein the set of one or more correction factors is to be applied to time domain echo data before NMR data inversion.

Embodiment 3

The method of Embodiments 1 or 2, wherein determining the set of one or more modifiers comprises determining a set of one or more alternations to an inversion matrix.

Embodiment 4

The method of Embodiments 1-3, wherein the modifier is determined after using machine learning techniques that reduces numerical dependencies to functional dependencies on dependent variables.

Embodiment 5

The method of any of Embodiments 1-4, further comprising verifying the set of one or more spin dynamics simulation results to be within a first error bound.

Embodiment 6

The method of any of Embodiments 1-5, wherein verifying the set of one or more spin dynamics simulation results to be within the first error bound comprises verifying the set of one or more spin dynamics simulation results is within the first error bound as compared against one or more characteristics of simulated or measured NMR logging data.

Embodiment 7

The method of any of Embodiments 1-6, wherein generating the B0/B1 model and running the one or more spin dynamics simulations is based on a set of one or more pulse sequences, wherein each of the set of modifiers corresponds to a different one of the set of pulse sequences.

Embodiment 8

The method of any of Embodiments 1-7, further comprising indicating for each of the set of modifiers the corresponding one of the set of pulse sequences.

Embodiment 9

The method of any of Embodiments 1-8, further comprising verifying the B0/B1 model accuracy within a first error bound.

Embodiment 10

The method of any of Embodiments 1-9, wherein verifying the B0/B1 model comprises comparing field values of the B0/B1 model against measured field values to determine whether the field values of the B0/B1 model exceed the first error bound.

Embodiment 11

The method of any of Embodiments 1-10, further comprising: based on a determination that the B0/B1 model fails verification, modifying the B/B1 model to satisfy the first error bound or generating a different B0/B1 model, wherein running the one or more spin dynamics simulations based, at least in part, on the B0/B1 model comprises running the one or more spin dynamics simulations with the B0/B1 model as modified or with the different B0/B1 model.

Embodiment 12

The method of any of Embodiments 1-11, wherein running the one or more spin dynamics simulations comprises varying radio frequency field based on a circuit simulation of transmitter circuitry of the NMR logging tool.

Embodiment 13

The method of any of Embodiments 1-12, further comprising obtaining circuit simulation data of receiver circuitry of the NMR logging tool, wherein calculating the one or more spin echoes is also based on the receiver circuitry circuit simulation data.

Embodiment 14

The method of any of Embodiments 1-13, wherein running the one or more spin dynamics simulations comprises varying at least one of a molecular diffusion parameter and a tool motion parameter.

Embodiment 15

The method of any of Embodiments 1-14, further comprising applying the set of one or more modifiers to NMR logging data processing.

Embodiment 16

The method of any of Embodiments 1-15, further comprising at least one of determining a value indicative of a petrophysical parameter and modifying drilling operations, based on NMR logging data generated after applying the set of one or more modifiers to the NMR logging data processing.

Embodiment 17

The method of any of Embodiments 1-16, further comprising iteratively and interactively generating the B0/B1 models and running the spin dynamics simulations.

Embodiment 18

One or more non-transitory machine-readable media comprising program code for determining a set of one or more modifiers for nuclear magnetic resonance (NMR) logging data processing to remove effects introduced by an NMR logging tool, the program code comprising instructions to generate a B0/B1 model that is based, at least in part, on the NMR logging tool; run one or more spin dynamics simulations based, at least in part, on the B0/B1 model to generate a set of one or more spin dynamics simulation results; compute a set of one or more spin echoes based, at least in part, on the set of one or more simulation results and the B0/B1 model; and determine the set of one or more modifiers to apply to NMR logging data processing, wherein determining the set of one or more modifiers is based, at least in part, on the set of one or more spin echoes.

Embodiment 19

The non-transitory machine-readable media of Embodiment 18, wherein the instructions to determine the set of one or more modifiers comprise first instructions to determine a set of one or more correction factors based on one or more differences between amplitudes of the set of one or more spin echoes and amplitudes of a set of one or more expected spin echoes, wherein the set of one or more correction factors is to be applied to time domain echo data before NMR data inversion; and second instructions to determine a set of one or more alternations to an inversion matrix.

Embodiment 20

An apparatus comprising: a processor; a machine-readable medium having stored therein program code executable by the processor to cause the apparatus to generate a B0/B1 model that is based, at least in part, on the NMR logging tool; run one or more spin dynamics simulations based, at least in part, on the B0/B1 model to generate a set of one or more spin dynamics simulation results; compute a set of one or more spin echoes based, at least in part, on the set of one or more simulation results and the B0/B1 model; and determine the set of one or more modifiers to apply to NMR logging data processing, wherein determining the set of one or more modifiers is based, at least in part, on the set of one or more spin echoes.

While the aspects of the disclosure are described with reference to various implementations and exploitations, it will be understood that these aspects are illustrative and that the scope of the claims is not limited to them. In general, techniques for NMR logging data revision to account for tool related effects as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

What is claimed is:

1. A method comprising:
generating a B0/B1 model that simulates a distribution of B0 and B1 fields within a target volume based, at least in part, on a nuclear magnetic resonance (NMR) logging tool design;
running one or more spin dynamics simulations based, at least in part, on the B0/B1 model to generate a set of one or more spin dynamics simulation results;
computing a set of one or more spin echoes based, at least in part, on the set of one or more simulation results and the B0/B1 model; and
determining a set of one or more modifiers to apply to NMR logging data processing, wherein determining the set of one or more modifiers is based, at least in part, on the set of one or more spin echoes.

2. The method of claim 1, wherein determining the set of one or more modifiers comprises determining a set of one or more correction factors based on one or more differences between amplitudes of the set of one or more spin echoes and amplitudes of a set of one or more expected spin echoes, wherein the set of one or more correction factors is to be applied to time domain echo data before NMR data inversion.

3. The method of claim 1, wherein determining the set of one or more modifiers comprises determining a set of one or more alternations to an inversion matrix.

4. The method of claim 3, wherein the modifier is determined using machine learning techniques that reduces numerical dependencies to functional dependencies on dependent variables.

5. The method of claim 1, further comprising verifying the set of one or more spin dynamics simulation results to be within a first error bound.

6. The method of claim 5, wherein verifying the set of one or more spin dynamics simulation results to be within the first error bound comprises verifying the set of one or more spin dynamics simulation results is within the first error bound as compared against one or more characteristics of simulated or measured NMR logging data.

7. The method of claim 1, wherein generating the B0/B1 model and running the one or more spin dynamics simulations is based on a set of one or more pulse sequences, wherein each of the set of modifiers corresponds to a different one of the set of pulse sequences.

8. The method of claim 7, further comprising indicating for each of the set of modifiers the corresponding one of the set of pulse sequences.

9. The method of claim 1, further comprising verifying the B0/B1 model accuracy within a first error bound.

10. The method of claim 9, wherein verifying the B0/B1 model comprises comparing field values of the B0/B1 model against measured field values to determine whether the field values of the B0/B1 model exceed the first error bound.

11. The method of claim 10, further comprising:
based on a determination that the B0/B1 model fails verification, modifying the B0/B1 model to satisfy the first error bound or generating a different B0/B1 model,
wherein running the one or more spin dynamics simulations based, at least in part, on the B0/B1 model comprises running the one or more spin dynamics simulations with the B0/B1 model as modified or with the different B0/B1 model.

12. The method of claim 1, wherein running the one or more spin dynamics simulations comprises varying radio frequency field based on a circuit simulation of transmitter circuitry of the NMR logging tool.

13. The method of claim 1, further comprising obtaining circuit simulation data of receiver circuitry of the NMR logging tool, wherein calculating the one or more spin echoes is also based on the receiver circuitry circuit simulation data.

14. The method of claim 1, wherein running the one or more spin dynamics simulations comprises varying at least one of a molecular diffusion parameter and a tool motion parameter.

15. The method of claim 1, further comprising applying the set of one or more modifiers to NMR logging data processing.

16. The method of claim 15, further comprising at least one of determining a value indicative of a petrophysical parameter and modifying drilling operations, based on NMR logging data generated after applying the set of one or more modifiers to the NMR logging data processing.

17. The method of claim 1 further comprising:
iteratively and interactively generating the B0/B1 models and running the spin dynamics simulations.

18. One or more non-transitory machine-readable media comprising program code for determining a set of one or more modifiers for nuclear magnetic resonance (NMR) logging data, the program code comprising instructions to:
generate a B0/B1 model that simulates a distribution of B0 and B1 fields within a target volume based, at least in part, on one or more design features of the NMR logging tool;
run one or more spin dynamics simulations based, at least in part, on the B0/B1 model to generate a set of one or more spin dynamics simulation results;
compute a set of one or more spin echoes based, at least in part, on the set of one or more simulation results and the B0/B1 model; and
determine the set of one or more modifiers to apply to NMR logging data processing, wherein determining the set of one or more modifiers is based, at least in part, on the set of one or more spin echoes.

19. The non-transitory machine-readable media of claim 18, wherein the instructions to determine the set of one or more modifiers comprise:
first instructions to determine a set of one or more correction factors based on one or more differences between amplitudes of the set of one or more spin echoes and amplitudes of a set of one or more expected spin echoes, wherein the set of one or more correction factors is to be applied to time domain echo data before NMR data inversion; and
second instructions to determine a set of one or more alternations to an inversion matrix.

20. An apparatus comprising:
a processor;
a machine-readable medium having stored therein program code executable by the processor to cause the apparatus to,
generate a B0/B1 model that simulates a distribution of B0 and B1 fields within a target volume based, at least in part, on a nuclear magnetic resonance (NMR) logging tool design;
run one or more spin dynamics simulations based, at least in part, on the B0/B1 model to generate a set of one or more spin dynamics simulation results;
compute a set of one or more spin echoes based, at least in part, on the set of one or more simulation results and the B0/B1 model; and
determine the set of one or more modifiers to apply to NMR logging data processing, wherein determining the set of one or more modifiers is based, at least in part, on the set of one or more spin echoes.

* * * * *